US009231127B2

(12) United States Patent
Fujimoto

(10) Patent No.: US 9,231,127 B2
(45) Date of Patent: Jan. 5, 2016

(54) LIGHT RECEIVING AND EMITTING ELEMENT AND SENSOR DEVICE USING SAME

(71) Applicant: KYOCERA Corporation, Kyoto-shi, Kyoto (JP)

(72) Inventor: Naoki Fujimoto, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/425,282

(22) PCT Filed: Aug. 29, 2013

(86) PCT No.: PCT/JP2013/073085
§ 371 (c)(1),
(2) Date: Mar. 2, 2015

(87) PCT Pub. No.: WO2014/034755
PCT Pub. Date: Mar. 6, 2014

(65) Prior Publication Data
US 2015/0243802 A1 Aug. 27, 2015

(30) Foreign Application Priority Data
Aug. 30, 2012 (JP) ................. 2012-189665

(51) Int. Cl.
| H01L 27/15 | (2006.01) |
| H01L 31/0216 | (2014.01) |
| H01L 31/12 | (2006.01) |
| H01L 31/14 | (2006.01) |
| H01L 31/153 | (2006.01) |
| H01L 33/48 | (2010.01) |
| H01L 33/62 | (2010.01) |
| H01L 31/0232 | (2014.01) |
| H01L 31/173 | (2006.01) |
| H01L 31/02 | (2006.01) |
| H01L 31/16 | (2006.01) |

(52) U.S. Cl.
CPC .... *H01L 31/02164* (2013.01); *H01L 31/02005* (2013.01); *H01L 31/02327* (2013.01); *H01L 31/12* (2013.01); *H01L 31/125* (2013.01); *H01L 31/145* (2013.01); *H01L 31/153* (2013.01); *H01L 31/16* (2013.01); *H01L 31/173* (2013.01); *H01L 33/48* (2013.01); *H01L 33/483* (2013.01); *H01L 33/486* (2013.01); *H01L 33/62* (2013.01)

(58) Field of Classification Search
None
See application file for complete search history.

(56) References Cited

U.S. PATENT DOCUMENTS

| 2008/0245949 A1* | 10/2008 | Morimoto | G01J 1/32 250/205 |
| 2009/0039377 A1* | 2/2009 | Horio | H05K 1/0206 257/99 |
| 2010/0109021 A1 | 5/2010 | Horio | |
| 2011/0199613 A1* | 8/2011 | Iijima | A61B 5/02438 356/445 |
| 2011/0260176 A1* | 10/2011 | Onoe | A61B 5/0261 257/79 |
| 2013/0272648 A1* | 10/2013 | Terada | G02B 6/43 385/14 |
| 2013/0292705 A1 | 11/2013 | Makimura et al. | |

FOREIGN PATENT DOCUMENTS

| JP | 58-118175 A | 7/1983 |
| JP | 10-041539 A | 2/1998 |
| JP | 2001-168377 A | 6/2001 |
| JP | 2007-201360 A | 8/2007 |
| JP | 2010-114196 A | 5/2010 |
| WO | 2012-098981 A1 | 7/2012 |

OTHER PUBLICATIONS

International Search Report dated Oct. 15, 2013, issued for International Application No. PCT/JP2013/073085.
\* cited by examiner

*Primary Examiner* — Minh-Loan Tran
(74) *Attorney, Agent, or Firm* — Procopio, Cory, Hargreaves & Savitch LLP

(57) ABSTRACT

A light receiving and emitting element includes a substrate; a light emitting element formed on an upper face of the substrate; a light receiving element formed on an upper face side of the substrate; a light emitting element-side first electrode pad; and a metal lump joined to the light emitting element-side first electrode pad. The light emitting element-side electrode pad is disposed the upper face of the substrate through an insulating layer so that the metal lump blocks light emitted from the light emitting element and propagating toward the light receiving element.

20 Claims, 5 Drawing Sheets

(a)

(b)

(a)

(b)

LIGHT RECEIVING AND EMITTING ELEMENT AND SENSOR DEVICE USING SAME

TECHNICAL FIELD

The present invention relates to a light receiving and emitting element in which a light receiving element and a light emitting element are disposed on a same substrate; and a sensor device using the same.

BACKGROUND ART

Various sensor devices have been conventionally proposed in which light is projected from a light emitting element onto an irradiated object and then regular reflection light and diffuse reflection light of the light incident on the irradiated object are received by a light receiving element so that characteristics of the irradiated object are detected. Such sensor devices are employed in a wide variety of fields, for example, in various applications such as a photo interrupter, a photo coupler, a remote control unit, an IrDA (Infrared Data Association) communication device, an optical fiber communication device, and a document size sensor.

For example, as described in Japanese Unexamined Patent Publication JP-A 2007-201360, a sensor device is used in which a light emitting element and a light receiving element are arranged individually on the same substrate and a light-shielding wall for separating a light receiving region and a light emitting region is provided.

Nevertheless, in such a sensor device, since light emitted from the light emitting element is projected directly onto the light receiving element, a problem arises that improvement of the sensing performance of the sensor device is difficult.

An object of the invention is to provide a light receiving and emitting element having a high sensing performance; and a sensor device using the same.

SUMMARY OF INVENTION

A light receiving and emitting element of the invention includes: a substrate composed of a one-conductivity type semiconductor; a light emitting element constituted such that a plurality of semiconductor layers including a one-conductivity type semiconductor layer and an opposed-conductivity type semiconductor layer are stacked on an upper face of the substrate; a light receiving element having an opposed-conductivity type semiconductor region in the substrate where opposed-conductivity type impurities are doped in a vicinity of the upper face of the substrate; at least one electrode pad which is connected individually to at least one of the substrate, the one-conductivity type semiconductor layer, the opposed-conductivity type semiconductor layer, and the opposed-conductivity type semiconductor region; and a metal lump joined to an upper face of the electrode pad. In order that the metal lump may block light emitted from the light emitting element and directed to the light receiving element, when the at least one electrode pad is connected to the substrate, at least one electrode pad is disposed on a part of the upper face of the substrate which is between the light emitting element and the light receiving element, and when the at least one electrode pad is connected to the one-conductivity type semiconductor layer, the opposed-conductivity type semiconductor layer, or the opposed-conductivity type semiconductor region, the at least one electrode pad is disposed on the upper face of the substrate through an insulating layer.

The sensor device of the invention is a sensor device using the above-mentioned light receiving and emitting element, light being projected from the light emitting element onto an irradiated object, in accordance with an output current from the light receiving element outputted in correspondence to reflected light from the irradiated object, at least one of position information, distance information, and concentration information of the irradiated object being detected.

DESCRIPTION OF EMBODIMENTS

Examples of an embodiment of a light receiving and emitting element of the invention and a sensor device using the same are described below with reference to the drawings. Here, the following examples merely illustrate an embodiment of the invention, and hence the invention is not limited to such an embodiment.

(Light Receiving and Emitting Element Module)

Figure 1:
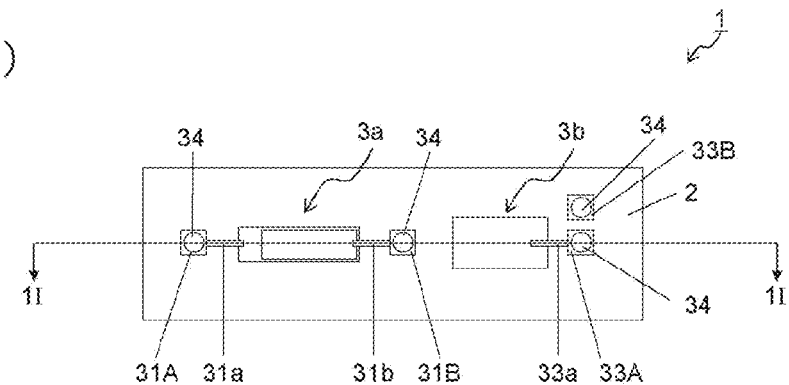
FIG. 1(a) is a plan view showing an example of an embodiment of a light receiving and emitting element of the invention.
FIG. 1(b) is a schematic sectional view taken along line 1I-1I in FIG. 1(a)
Figure 1:
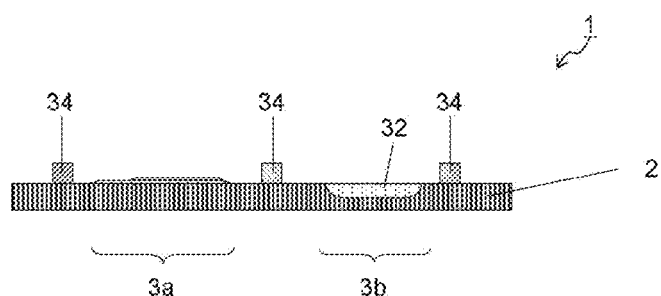

A light receiving and emitting element 1 shown in FIGS. 1(a) and 1(b) is built in an image forming apparatus such as a copy machine and a printer and thereby serves as a sensor device for detecting position information, distance information, or concentration information of an irradiated object such as toner or media.

The light receiving and emitting element 1 includes: a substrate 2; and a light emitting element 3a and a light receiving element 3b which are disposed on an upper face of the substrate 2.

The substrate 2 is composed of a one-conductivity type semiconductor material. The one-conductivity type impurity concentration is not limited in particular. In the present example, an n-type silicon (Si) substrate is used in which phosphorus (P) serving as one-conductivity type impurities is contained in a concentration of $1\times10^{17}$ to $2\times10^{17}$ atoms/cm$^3$ in a silicon (Si) substrate. As the n-type impurities, in addition to phosphorus (P), for example, nitrogen (N), arsenic (As), antimony (Sb), and bismuth (Bi) may be used. Further, the doping concentration is set to be $1\times10^{16}$ to $1\times10^{20}$ atoms/cm$^3$.

Hereinafter, n-type is adopted as a one-conductivity type, and p-type is adopted as an opposed-conductivity type.

The light emitting element 3a is disposed on the upper face of the substrate 2 and the light receiving element 3b is disposed in correspondence to the light emitting element 3a. The light emitting element 3a serves as a light source of light to be projected onto the irradiated object. The light emitted from the light emitting element 3a is reflected by the irradiated object and then enters the light receiving element 3b. The light receiving element 3b serves as a light detection section for detecting entry of light.

Figure 2:
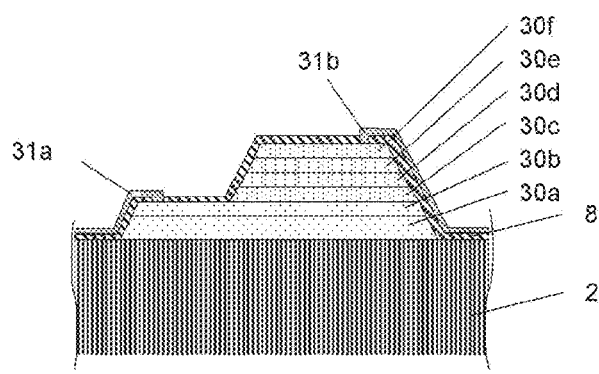
FIG. 2(a) is a sectional view of a light emitting element constituting the light receiving and emitting element shown in FIG. 1.
FIG. 2(b) is a sectional view of a light receiving element constituting the light receiving and emitting element shown in FIG. 1.
Figure 2:
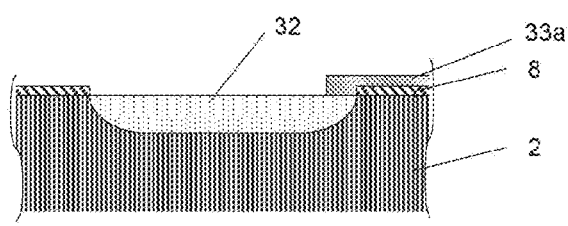

As shown in FIG. 2(a), the light emitting element 3a is formed by stacking a plurality of semiconductor layers on the upper face of the substrate 2.

First, on the upper face of the substrate 2, a buffer layer 30a is formed for buffering a difference in lattice constant between the substrate 2 and a semiconductor layer (a later-described n-type contact layer 30b in the present example) stacked on the upper face of the substrate 2. The buffer layer 30a has a function of buffering the difference in lattice constant between the substrate 2 and the semiconductor layer formed on the upper face of the substrate 2 so as to reduce lattice defects such as lattice strain generated between the substrate 2 and the semiconductor layer and further reduce lattice defects or crystal defects in the entire semiconductor layer formed on the upper face of the substrate 2.

The buffer layer 30a of the present example is composed of gallium arsenide (GaAs) containing no impurities and the thickness thereof is set to be approximately 2 to 3 μm. Here, when the difference in lattice constant between the substrate 2 and the semiconductor layer stacked on the upper face of the substrate 2 is not large, the buffer layer 30a may be omitted.

An n-type contact layer 30b is formed on an upper face of the buffer layer 30a. In the n-type contact layer 30b, silicon (Si), selenium (Se), or the like which is n-type impurities is doped into gallium arsenide (GaAs). The doping concentration is set to be approximately $1\times10^{16}$ to $1\times10^{20}$ atoms/cm$^3$ and the thickness thereof is set to be approximately 0.8 to 1 μm.

In the present example, silicon (Si) is doped as n-type impurities in a doping concentration of $1\times10^{18}$ to $2\times10^{18}$ atoms/cm$^3$. A part of an upper face of the n-type contact layer 30b is exposed. The exposed part is connected through a light emitting element-side first electrode 31a (a first electrode 31a) to a light emitting element-side first electrode pad 31A (a first electrode pad 31A). The first electrode pad 31A is electrically connected through a metal lump 34 to an external power supply. In the present example, the first electrode pad 31A is connected to the external power supply by wire bonding using a gold (Au) wire. Here, the metal lump 34 of the present example indicates a gold (Au) bump joined to the first electrode pad 31A. In the figure, the metal lump 34 which is a gold (Au) bump for wire bonding is depicted alone, and any wire is omitted for simplicity (this situation is the same for the other figures given later). In place of the gold (Au) wire, a wire such as an aluminum (Al) wire or a copper (Cu) wire may also be selected. Further, in the present example, in place of the wire bonding, an electric wire may be joined to the first electrode pad 31A by a solder or the like. Alternatively, a gold stud bump may be formed on an upper face of the first electrode pad 31A and then an electric wire may be joined to the gold (Au) stud bump by a solder or the like. In these cases, the metal lump 34 corresponds to the solder, and a joining material composed of the gold (Au) stud bump and the solder, respectively. The n-type contact layer 30b has a function of lowering the contact resistance with the first electrode 31a connected to the n-type contact layer 30b.

Here, it is preferable that the thickness of the metal lump 34 in the normal line direction of the substrate 2 is set to be larger than the thickness of the light emitting element 3a. When the thickness of the metal lump 34 is set to be larger than the thickness of the light emitting element 3a, a possibility is reduced that light emitted from the light emitting element 3a passes above the metal lump 34 and then is projected onto the light receiving element 3b.

The first electrode 31a and the first electrode pad 31A are formed so as to have a thickness of approximately 0.5 to 5 μm by using a gold (Au) antimony (Sb) alloy, a gold (Au) germanium (Ge) alloy, a Ni-based alloy, or the like. In addition, the first electrode 31a and the first electrode pad 31A are disposed on an insulating layer 8 formed so as to cover the upper face of the n-type contact layer 30b from the upper face of the substrate 2, and hence are electrically insulated from the substrate 2 and from semiconductor layers other than the n-type contact layer 30b.

For example, the insulating layer 8 is formed from an inorganic insulating film of silicon nitride (SiN$_x$), silicon oxide (SiO$_2$), or the like or an organic insulating film of polyimide or the like. The thickness thereof is set to be approximately 0.1 to 1 μm.

An n-type clad layer 30c is formed on the upper face of the n-type contact layer 30b and has a function of confining positive holes to an active layer 30d described later. In the n-type clad layer 30c, silicon (Si), selenium (Se), or the like which is n-type impurities is doped into aluminum gallium arsenide (AlGaAs). The doping concentration is set to be approximately $1\times10^{16}$ to $1\times10^{20}$ atoms/cm$^3$ and the thickness thereof is set to be approximately 0.2 to 0.5 μm. In the present example, silicon (Si) is doped as n-type impurities in a doping concentration of $1\times10^{17}$ to $5\times10^{17}$ atoms/cm$^3$.

An active layer 30d is formed on an upper face of the n-type clad layer 30c and serves as a light emitting layer in which carriers such as electrons and positive holes are concentrated and recombine with each other so that light is emitted. The active layer 30d is composed of aluminum gallium arsenide (AlGaAs) containing no impurities and the thickness thereof is set to be approximately 0.1 to 0.5 μm. Here, although the active layer 30d of the present example is a layer containing no impurities, a p-type active layer containing p-type impurities or an n-type active layer containing n-type impurities may be adopted. However, the band gap of the active layer 30d need be smaller than the band gaps of the n-type clad layer 30c and a p-type clad layer 30e described later.

A p-type clad layer 30e is formed on an upper face of the active layer 30d and has a function of confining electrons to the active layer 30d. In the p-type clad layer 30e, zinc (Zn), magnesium (Mg), carbon (C), or the like which is p-type impurities is doped into aluminum gallium arsenide (AlGaAs). The doping concentration is set to be approximately $1\times10^{16}$ to $1\times10^{20}$ atoms/cm$^3$ and the thickness thereof is set to be approximately 0.2 to 0.5 μm. In the present example, magnesium (Mg) is doped as p-type impurities in a doping concentration of $1\times10^{19}$ to $5\times10^{20}$ atoms/cm$^3$.

A p-type contact layer 30f is formed on an upper face of the p-type clad layer 30e. In the p-type contact layer 30f, zinc (Zn), magnesium (Mg), carbon (C), or the like which is p-type impurities is doped into aluminum gallium arsenide (AlGaAs). The doping concentration is set to be approximately $1\times10^{16}$ to $1\times10^{20}$ atoms/cm$^3$ and the thickness thereof is set to be approximately 0.2 to 0.5 μm.

The p-type contact layer 30f is connected through a light emitting element-side second electrode 31b (a second electrode 31b) to a light emitting element-side second electrode pad 31B (a second electrode pad 31B). Similarly to the light emitting element-side first electrode pad 31A, the second electrode pad 31B is electrically connected through a metal lump 34 to the external power supply. Variations in the connection method and the joining form are similar to those of the first electrode pad 31A. The p-type contact layer 30f has a function of lowering the contact resistance with the light emitting element-side second electrode 31b connected to the p-type contact layer 30f.

Here, a cap layer having a function of suppressing oxidization of the p-type contact layer 30f may be formed on an upper face of the p-type contact layer 30f. For example, the cap layer may be formed from gallium arsenide (GaAs) containing no impurities and the thickness thereof may be set to be approximately 0.01 to 0.03 µm.

For example, the second electrode 31b and the second electrode pad 31B are formed of a AuNi, AuCr, AuTi, or AlCr alloy obtained by combining gold (Au) or aluminum (Al) with nickel (Ni), chromium (Cr), or titanium (Ti) which is an adhesion layer. The thickness thereof is set to be approximately 0.5 to 5 µm. Further, the second electrode 31b and the second electrode pad 31B are disposed on the insulating layer 8 formed so as to cover the upper face of the p-type contact layer 30f from the upper face of the substrate 2, and hence are electrically insulated from the substrate 2 and from the semiconductor layers other than the p-type contact layer 30f.

In the light emitting element 3a having the configuration described above, when a bias is applied between the first electrode pad 31A and the second electrode pad 31B, the active layer 30d emits light so as to serve as a light source.

As shown in FIG. 2(b), the light receiving element 3b is constituted such that a p-type semiconductor region 32 is disposed on the upper face of the substrate 2 so that a p-n junction is formed in cooperation with the n-type substrate 2. The p-type semiconductor region 32 is formed by diffusing p-type impurities at a high concentration into the substrate 2. Examples of usable p-type impurities include zinc (Zn), magnesium (Mg), carbon (C), boron (B), indium (In), and selenium (Se). Further, the doping concentration is set to be $1 \times 10^{16}$ to $1 \times 10^{20}$ atoms/cm$^3$. In the present example, boron (B) are diffused as p-type impurities such that the thickness of the p-type semiconductor region 32 becomes approximately 0.5 to 3 µm.

The p-type semiconductor region 32 is electrically connected through a light receiving element-side first electrode 33a (a third electrode 33a) to a light receiving element-side first electrode pad 33A (a third electrode pad 33A). A light receiving element-side second electrode pad 33B (a fourth electrode pad 33B) is electrically connected to the substrate 2 which is an n-type semiconductor.

The third electrode 33a and the third electrode pad 33A are disposed on the upper face of the substrate 2 through the insulating layer 8, and hence are electrically insulated from the substrate 2. On the other hand, the fourth electrode pad 33B is disposed on the upper face of the substrate 2.

The third electrode 33a, the third electrode pad 33A, and the fourth electrode pad 33B are formed so as to have a thickness of approximately 0.5 to 5 µm by using a gold (Au) antimony (Sb) alloy, a gold (Au) germanium (Ge) alloy, a Ni-based alloy, or the like.

In the light receiving element 3b having the configuration described above, when light enters the p-type semiconductor region 32, a photocurrent is generated by the photoelectric effect and then the photocurrent is extracted through the third electrode pad 33A so that the light receiving element 3b serves as a light detection section. Here, when a reverse bias is applied between the third electrode pad 33A and the fourth electrode pad 33B, the light detection sensitivity of the light receiving element 3b increases. Thus, this configuration is preferable.

Here, arrangement of the first electrode pad 31A, the second electrode pad 31B, the third electrode pad 33A, and the fourth electrode pad 33B is described below.

In the case of the present example, the second electrode pad 31B is disposed on the upper face of the substrate 2 between the light emitting element 3a and the light receiving element 3b through the insulating layer 8. Then, the first electrode pad 31A is disposed together with the second electrode pad 31B so as to be located on both sides of the light emitting element 3a. The third electrode pad 33A and the fourth electrode pad 33B are disposed together with the second electrode pad 31B so as to be located on both sides of the light receiving element 3b. The first electrode pad 31A and the third electrode pad 33A are disposed on the upper face of the substrate 2 through the insulating layer 8. The fourth electrode pad 33B is disposed on the upper face of the substrate 2.

When the second electrode pad 31B is disposed on the upper face of the substrate 2 between the light emitting element 3a and the light receiving element 3b through the insulating layer 8, light emitted from the light emitting element 3a and directed to the light receiving element 3b is blocked by the metal lump 34 joined to the upper face of the second electrode pad 31B. Thus, direct irradiation of the light receiving element 3b with the light emitted from the light emitting element 3a can be suppressed, and a light receiving and emitting element having a high sensing performance can be realized.

Here, in the present example, although, on the upper face of the substrate 2 between the light emitting element 3a and the light receiving element 3b, the second electrode pad 31B is disposed through the insulating layer 8, any of the first electrode 31a, the third electrode pad 33A, and the fourth electrode pad 33B may be disposed. It should be noted that when the fourth electrode pad 33B is disposed, the fourth electrode pad 33B is disposed on the upper face of the substrate 2 without intervention of the insulating layer 8.

Further, a single light emitting element 3a or a single light receiving element 3b may be located on the substrate, or a plurality of light emitting elements 3a or a plurality of light receiving elements 3b may be located on the substrate.

(Method for Manufacturing Light Receiving and Emitting Element)

Next, an example of a method for manufacturing the light receiving and emitting element 1 is described below.

First, the substrate 2 in which n-type impurities are doped into silicon (Si) is prepared. Then, by using a thermal oxidation method, a diffusion blocking film S (not shown) composed of silicon oxide (SiO$_2$) is formed on the substrate 2.

A photoresist is coated on the diffusion blocking film S, exposure with a desired pattern and development are performed by photolithography, and then an opening portion Sa (not shown) used for forming the p-type semiconductor region 32 is formed in the diffusion blocking film S by wet etching. The opening portion Sa is not necessarily required to penetrate the diffusion blocking film S.

Then, a poly boron film (PBF) is coated on the diffusion blocking film S. Then, by using a thermal diffusion method, boron (B) contained in the poly boron film (PBF) is diffused into the inside of the substrate 2 through the opening portion Sa of the diffusion blocking film S so that the p-type semiconductor region 32 is formed. At that time, for example, the thickness of the poly boron film (PBF) is set to be 0.1 to 1 µm and then thermal diffusion is performed at a temperature of 700° C. to 1200° C. in an atmosphere containing nitrogen ($N_2$) and oxygen ($O_2$). Then, the diffusion blocking film S is removed.

Next, the substrate 2 is subjected to heat treatment in a reactor of an MOCVD (Metal-organic Chemical Vapor Deposition) apparatus so that a natural oxidation film formed in the surface of the substrate 2 is removed. This heat treatment is performed, for example, at a temperature of 1000° C. for 10 minutes or the like.

Then, by using MOCVD, the individual semiconductor layers (the buffer layer 30a, the n-type contact layer 30b, the n-type clad layer 30c, the active layer 30d, the p-type clad layer 30e, and the p-type contact layer 30f) constituting the light emitting element 3a are stacked on the substrate 2 one on top of another. Then, a photoresist is coated on the stacked semiconductor layers L (not shown), then exposure with a desired pattern and development are performed by photolithography, and then the light emitting element 3a is formed by wet etching. Here, etching is performed plural times such that a part of the upper face of the n-type contact layer 30b is exposed. After that, the photoresist is removed.

Next, by using thermal oxidation, sputtering, plasma CVD, or otherwise, the insulating layer 8 is formed so as to cover the exposed surface of the light emitting element 3a and the upper face of the substrate 2 (including the p-type semiconductor region 32). Then, a photoresist is coated on the insulating layer 8, then exposure with a desired pattern and development are performed by photolithography, and then, by using wet etching, later-described openings used for connecting the first electrode 31a, the second electrode 31b, and the third electrode 33a to the n-type contact layer 30b, the p-type contact layer 30f, and the p-type semiconductor region 32, respectively, are formed in the insulating layer 8. Then, the photoresist is removed.

Next, a photoresist is coated on the insulating layer 8, then exposure with a desired pattern and development are performed by photolithography, and then, by using resistance heating, sputtering, or otherwise, an alloy film used for forming the first electrode 31a, the first electrode pad 31A, the third electrode 33a, the third electrode pad 33A, and the fourth electrode pad 33B is formed. Then, by using a lift-off method, the photoresist is removed, and the first electrode 31a, the first electrode pad 31A, the third electrode 33a, the third electrode pad 33A, and the fourth electrode pad 33B are formed into desired shapes. Similarly, the second electrode 31b and the second electrode pad 33B are formed by a similar process, respectively.

(Sensor Device)

Next, a sensor device 100 provided with the light receiving and emitting element 1 is described below. Hereinafter, by way of example, there is described a case where the light receiving and emitting element 1 is applied to a sensor device for detecting the position of toner T (an irradiated object) adhered onto an intermediate transfer belt V in an image forming apparatus.

Figure 3:
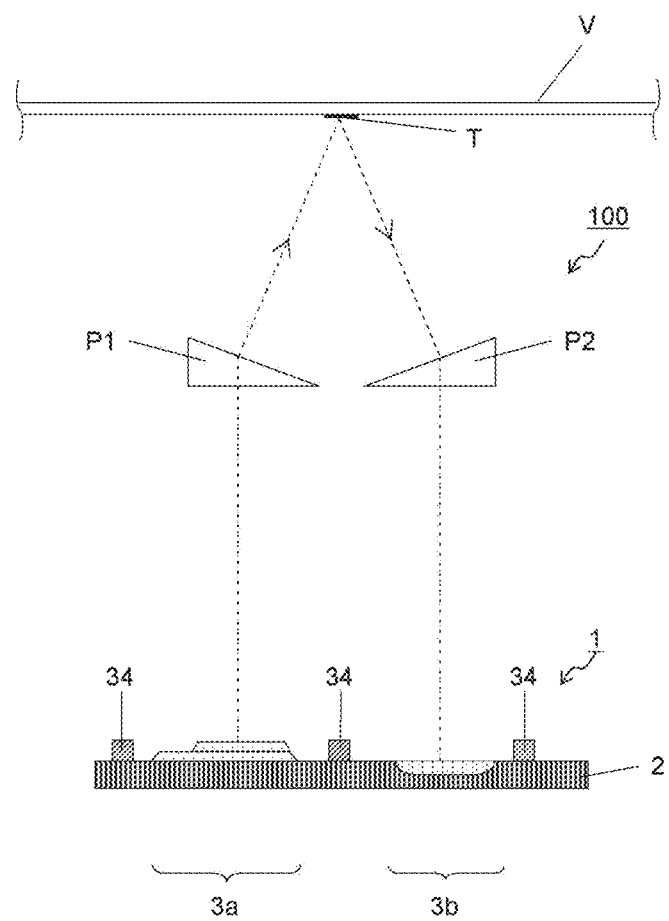
FIG. 3 is a schematic sectional view showing an example of an embodiment of a sensor device using the light receiving and emitting element shown in FIG. 1.

As shown in FIG. 3, the sensor device 100 of the present example is disposed such that a surface of the sensor device 100 on which the light emitting element 3a and the light receiving element 3b of the light receiving and emitting element 1 are formed faces the intermediate transfer belt V. Then, light is projected from the light emitting element 3a onto the intermediate transfer belt V or onto the toner T borne on the intermediate transfer belt V. In the present example, a prism P1 is disposed above the light emitting element 3a and a prism P2 is disposed above the light receiving element 3b, whereby light emitted from the light emitting element 3a is refracted by the prism P1 and then incident on the intermediate transfer belt V or on the toner T borne on the intermediate transfer belt V. Then, regular reflection light L2 of this incident light L1 is refracted by the prism P2 and then received by the light receiving element 3b. In the light receiving element 3b, a photocurrent is generated in correspondence to the intensity of the received light and then the photocurrent is detected through the third electrode 33a and the like by an external device.

As described above, in the sensor device 100 of the present example, a photocurrent corresponding to the intensity of the regular reflection light from the intermediate transfer belt V or the toner T can be detected. Thus, for example, the position of the toner T can be detected in accordance with the photocurrent value detected by the light receiving element 3b. Here, the intensity of the regular reflection light depends also on the concentration of the toner T. Thus, the concentration of the toner T can also be detected in accordance with the magnitude of the generated photocurrent. Similarly, the intensity of the regular reflection light depends also on the distance of the toner T from the light receiving and emitting element array 3. Thus, the distance between the light receiving and emitting element array 3 and the toner T can also be detected in accordance with the magnitude of the generated photocurrent.

According to the sensor device 100 of the present example, the above-mentioned advantageous effects of the light receiving and emitting element 1 can be obtained.

Although examples of the specific embodiment of the invention have been illustrated above, the invention is not limited to these, and various changes can be made without departing from the scope of the invention.

Figure 4:
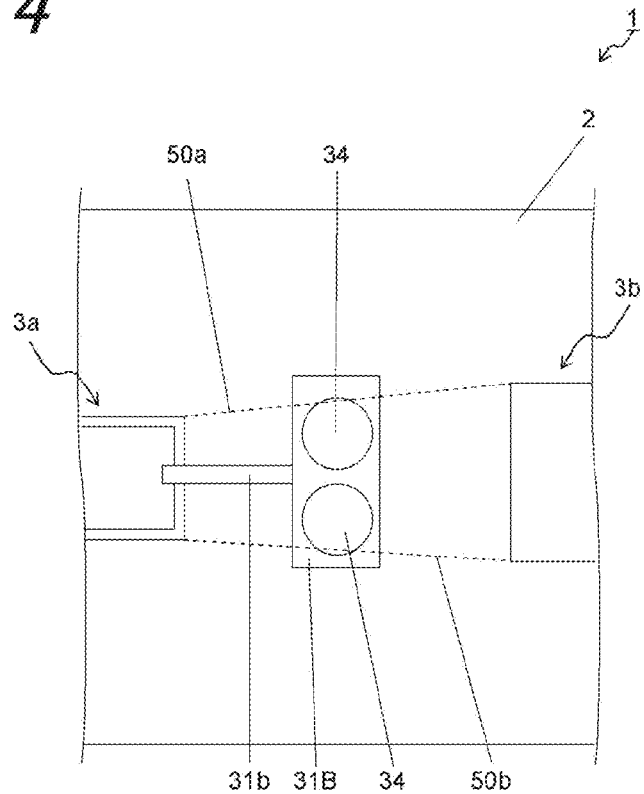
FIG. 4 is a main part plan view showing a first modified example of the light receiving and emitting element shown in FIG. 1.

For example, as in a first modified example shown in FIG. 4, the second electrode pad 31B may be disposed so as to intersect with a line segment 50a which joins one end of a side of the light emitting element 3a which side is opposite to the light receiving element 3b and one end of a side of the light receiving element 3b which side is opposite to the light emitting element 3a or with a line segment 50b which joins the other end of the side of the light emitting element 3a which side is opposite to the light receiving element 3b and the other end of the side of the light receiving element 3b which side is opposite to the light emitting element 3a, and a plurality (two in the present modified example) of the metal lumps 34 may be joined to the second electrode pad 31B.

When such a configuration is adopted, direct irradiation of the light receiving element 3b with light emitted from the light emitting element 3a can be further suppressed, and a light receiving and emitting element having a high sensing performance can be realized.

Here, in a case where a plurality of the light emitting elements 3a and a plurality of the light receiving elements 3b are provided, it is sufficient that the line segment 50a and the line segment 50b are formed by one ends and the other ends of the light emitting element 3a and the light receiving element 3b located at ends of the alignment of the light emitting elements 3a and the light receiving elements 3b, respectively, when viewed from the light receiving element 3b side and the light emitting element 3a side. That is, the light emitting element 3a and the light receiving element 3b need be disposed between straight lines containing the line segment 50a and the line segment 50b, respectively.

Figure 5:
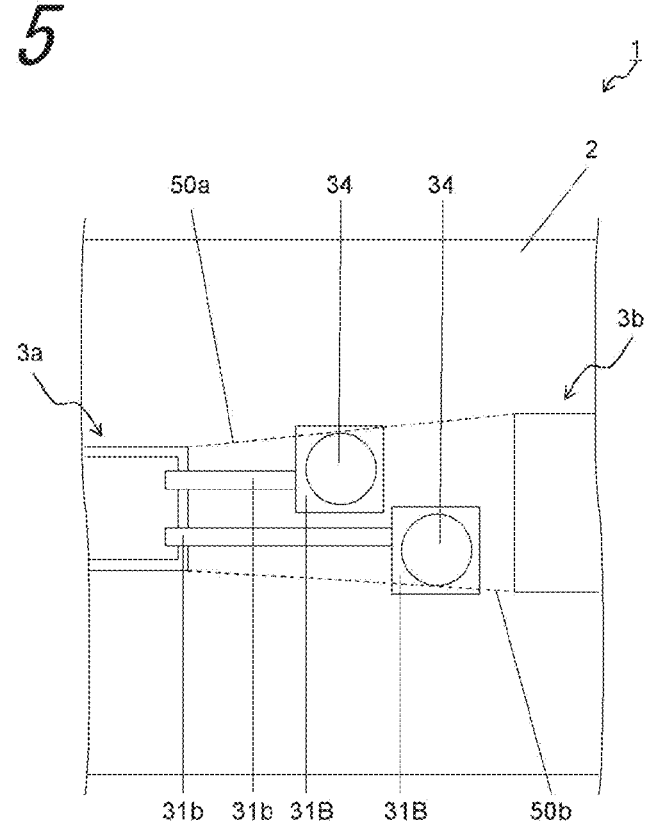
FIG. 5 is a main part plan view showing a second modified example of the light receiving and emitting element shown in FIG. 1.

Further, as in a second modified example shown in FIG. 5, a plurality of the second electrode pads 31B may be aligned side by side between the light emitting element 3a and the light receiving element 3b. Thus, when the light receiving element 3b side is viewed from the light emitting element 3a side, adjacent ones of the plurality of second electrode pads 31B may overlap partly with each other. Further, second electrode pads 31B located at ends of an alignment of the plurality of second electrode pads 31B may be disposed so as to intersect with the line segment 50a which joins one end of a side of the light emitting element 3a which side is opposite to the light receiving element 3b and one end of a side of the light receiving element 3b which side is opposite to the light emitting element 3a or with the line segment 50b which joins the other end of the side of the light emitting element 3a which side is opposite to the light receiving element 3b and the other end of the side of the light receiving element 3b which side is opposite to the light emitting element 3a, and at least one metal lump 34 may be joined to each of the plurality of second electrode pads 31B. Here, the language "the light receiving element 3b side is viewed from the light emitting element 3a side" indicates a view in a direction from the light emitting element 3a toward the light receiving element 3b in a side view.

When such a configuration is adopted, direct irradiation of the light receiving element 3b with light emitted from the light emitting element 3a can be further suppressed, and a light receiving and emitting element having a high sensing performance can be realized.

Here, in the second modified example, the plurality of electrode pads are composed of the second electrode pads 31B alone. Instead, the first electrode pads 31A, the third electrode pads 33A, and the fourth electrode pads 33B may be used, and any combination of these electrode pads may be used. Further, the number of individual electrode pads may be set up appropriately.

Figure 6:
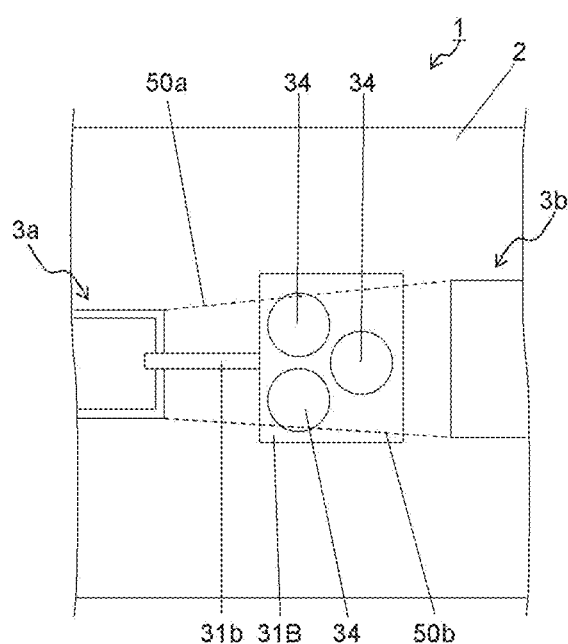
FIG. 6(a) is a main part plan view showing a third modified example of the light receiving and emitting element shown in FIG. 1.
FIG. 6(b) is a main part plan view showing a fourth modified example of the light receiving and emitting element shown in FIG. 1.
Figure 6:
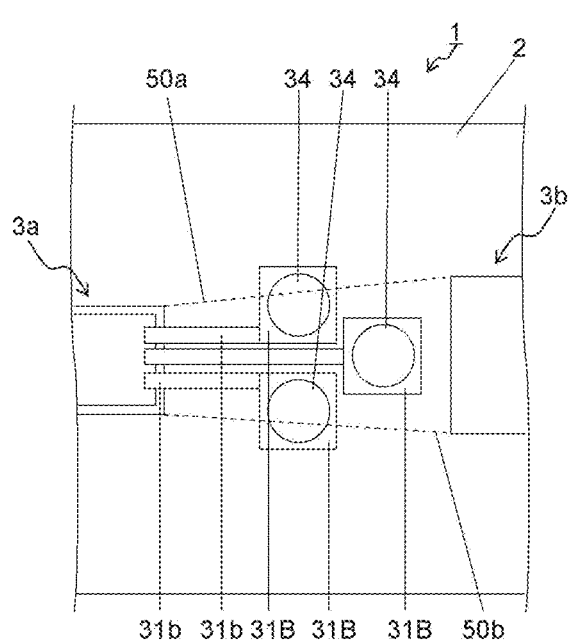

Further, as in a third modified example and a fourth modified example shown in FIGS. 6(a) and 6(b), when the light receiving element 3b side is viewed from the light emitting element 3a side, adjacent ones of the plurality of metal lumps 34 may overlap partly with each other.

When such a configuration is adopted, when the light receiving element 3b side is viewed from the light emitting element 3a side, the metal lumps 34 are disposed without gaps. Thus, direct irradiation of the light receiving element 3b with light emitted from the light emitting element 3a can be further suppressed, and a light receiving and emitting element having a high sensing performance can be realized.

This is because the light emitted from the light emitting element 3a and passing above a region encompassed by the line segment 50a and the line segment 50b is light having the possibility of being projected onto the light receiving element 3b, and hence, when the light passing above the region is blocked, the light emitted from the light emitting element 3a is not projected onto the light receiving element 3b.

Figure 7:
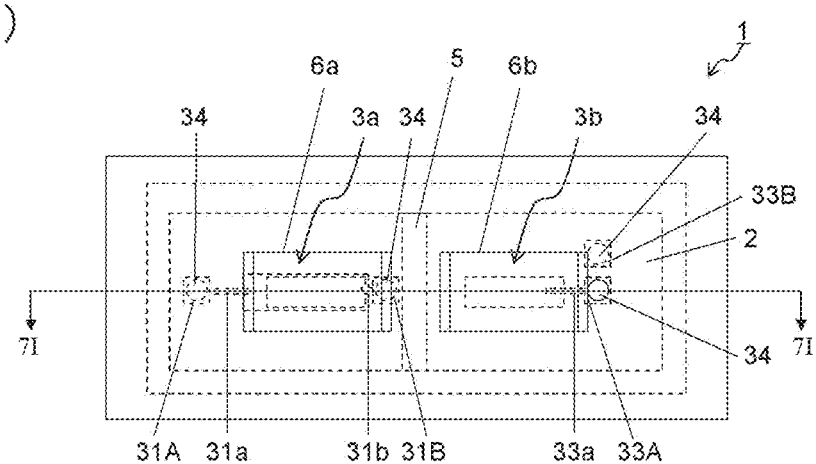
FIG. 7 is a main part plan view showing a fifth modified example of the light receiving and emitting element shown in FIG. 1.
Figure 7:
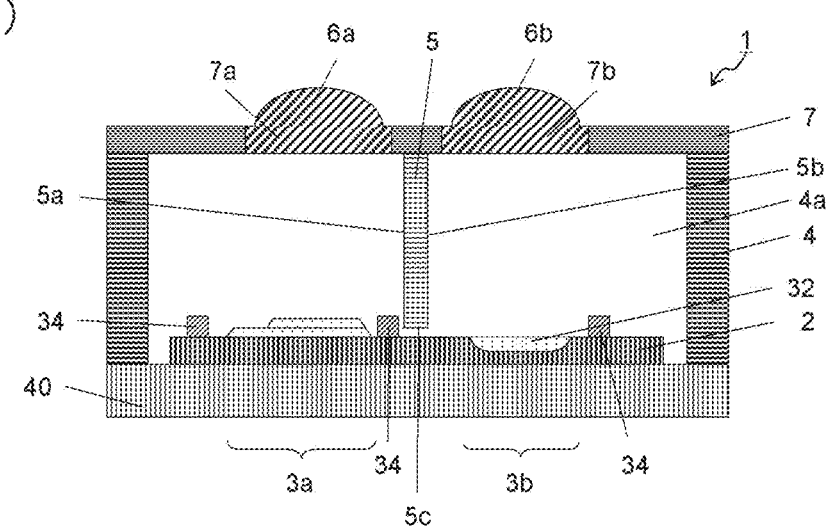

Further, as in a fifth modified example shown in FIG. 7, the light receiving and emitting element 1 may include: a substrate 2 in which a light emitting element 3a and a light receiving element 3b are provided on an upper face of a wiring board 40; a frame-shaped outer wall 4 disposed so as to surround the substrate 2; a light-shielding wall 5 for partitioning an inner space 4a of the outer wall 4 located on the inner side of the outer wall 4 into spaces corresponding to the light emitting element 3a and the light receiving element 3b, respectively; and an upper wall 7 for covering the substrate 2 and supporting a light receiving element-side lens 6a and a light emitting element-side lens 6b corresponding to the light emitting element 3a and the light receiving element 3b, respectively.

Then, the light-shielding wall 5 may have a lower surface 5c opposite to the substrate 2 and the interval between the substrate 2 and the lower surface 5c of the light-shielding wall 5 may be set to be smaller than the thickness of the metal lump 34 in the normal line direction of the light emitting element-side first electrode pad 31B.

The wiring board 40 serves as a wiring board used for electrical connection to the substrate 2 and an external device, the wiring board being configured to apply a bias to the light emitting element 3a and the light receiving element 3b formed in the substrate 2, or exchange electric signals between the substrate 2 and the external device.

The outer wall 4 is connected to the upper face of the wiring board 40 via adhesives 9 (not shown) so as to surround the substrate 2. Then, the outer wall 4 has functions of: suppressing scattering of light emitted from the light emitting element 3a in directions other than the direction toward the irradiated object; suppressing entry of light other than that reflected by the irradiated object into the light receiving element 3b; and protecting the wiring board 40 and the substrate 2 from the external environment.

The outer wall 4 is formed of: a general-use plastic such as polypropylene resin (PP), polystyrene resin (PS), polyvinyl chloride resin (PVC), polyethylene terephthalate resin (PET), or acrylonitrile/butadiene/styrene resin (ABS); an engineering plastic such as polyamide resin (PA) or polycarbonate resin (PC); a super engineering plastic such as liquid crystal polymer; or a metallic material such as aluminum (Al) or titanium (Ti).

Here, the dimensions of length and width of the outer wall 4 may be the same as or different from the dimensions of length and width of the substrate 2. It is sufficient that the dimensions of length and width of the outer wall 4 are those capable of surrounding at least the light emitting element 3a and the light receiving element 3b.

The light-shielding wall 5 is disposed on the inner side of the outer wall 4 so as to partition the inner space 4a of the outer wall 4 into spaces corresponding to the light emitting element 3a and the light receiving element 3b. The language "disposed so as to partition the inner space 4a of the outer wall 4 into spaces corresponding to the light emitting element 3a and the light receiving element 3b" indicates such disposition that, when the wiring board 40 is viewed from the light receiving and emitting element 1 side, the light emitting element 3a exists in one space formed by the light-shielding wall 5 and the outer wall 4 and the light receiving element 3b exists in the other space.

The light-shielding wall 5 has a function of suppressing entry of light emitted from the light emitting element 3a into the light receiving element 3b without being reflected by the irradiated object.

The light-shielding wall 5 is disposed so as not to be in contact with the wiring board 40 and the substrate 2. By virtue of such disposition, even when the light receiving and emitting element 1 generates heat caused by its driving or the light-shielding wall 5 receives heat from the external environment so that the dimensions of the light-shielding wall 5 increase by thermal expansion, the light-shielding wall 5 does not abut against the substrate 2 in which the light emitting element 3a and the light receiving element 3b are formed. Thus, the positional relation between the light emitting element 3a and the light receiving element 3b can be maintained, and the sensing performance can be improved.

The light-shielding wall 5 has a light emitting element-side light-shielding surface 5a (a first surface 5a) located on the light emitting element 3a side; a light receiving element-side light-shielding surface 5b (a second surface 5b) located on the light receiving element 3b side; and a lower surface 5c connected to the light emitting element-side light-shielding surface 5a and the light receiving element-side light-shielding surface 5b.

The first surface 5a and the second surface 5b of the fifth modified example may have any kind of shape as long as the inner space 4a of the outer wall 4 can be partitioned into spaces corresponding to the light emitting element 3a side and the light receiving element 3b side. In the fifth modified example, the first surface 5a and the second surface 5b are disposed along the normal line direction of the upper face of the substrate 2 and between the light emitting element 3a and the light receiving element 3b, and abut against the outer wall 4. The length extending between the light emitting element 3a and the light receiving element 3b need be at least longer than or equal to the length of the light emitting element 3a. Otherwise, the space on the light receiving element 3b side is directly irradiated with the light emitted from the light emitting element 3a.

A similar material to the outer wall 4 may be used for the light-shielding wall 5.

The upper wall 7 is disposed so as to cover the wiring board 40 and the substrate 2. The upper wall 7 of the fifth modified example is disposed so as to abut against the upper end of the outer wall 4. Then, through holes 7a and 7b are provided at positions corresponding to the light emitting element 3a and the light receiving element 3b. The upper wall 7 has a function of protecting the substrate 2 and the light receiving and emitting element array 3 from the external environment and serves also as a support for lenses 6a and 6b described later.

For the upper wall 7, a similar material to the outer wall 4 and the light-shielding wall 5 may be used.

Here, the outer wall 4, the light-shielding wall 5, and the upper wall 7 of the fifth modified example are integrally formed by injection molding with polycarbonate resin (PC).

The light emitting element-side lens 6a and the light receiving element-side lens 6b are disposed in correspondence to the through holes 7a and 7b of the upper wall 7 and have a function of condensing the light emitted from the light emitting element 3a and a function of condensing the light reflected by the irradiated object, respectively. Here, in the description, the light emitting element-side lens 6a and the light receiving element-side lens 6b are simply referred to as lenses 6a and 6b in some cases. when these lenses 6a and 6b are provided, even in a case where the distance between the light receiving and emitting element 1 and the irradiated object becomes long, a high sensing performance can be obtained.

Examples of usable materials for the lenses 6a and 6b include: plastics such as thermosetting resin including silicone resin, urethane resin and epoxy resin, and thermoplastic resin such as polycarbonate resin and acrylic resin; sapphire; and inorganic glass.

The lenses 6a and 6b of the fifth modified example are cylindrical lenses formed of silicone resin and have a curvature in a direction perpendicular to the longitudinal direction of the through hole 7a and the through hole 7b, that is, perpendicular to the direction along the row of the light receiving elements 3a and the row of the light emitting elements 3b formed in the light receiving and emitting element array 3. Attachment of the lenses 6a and 6b to the upper wall 7 may be performed by using organic adhesives such as silicone resin.

In the present example, a straight line passing through the center of the light emitting part of the light emitting element 3a and a straight line passing through the center of the light receiving part of the light receiving element 3b are substantially agree with the optical axes of the lenses 6a and 6b, respectively. Each optical axis substantially agrees with the normal line direction going upward from the upper face of the light receiving and emitting element array 3. When such a configuration is adopted, the light emitted from the light emitting element 3a can be projected onto the irradiated object at a high illuminance, and hence a high illuminance can be obtained when the light emitted from the light emitting element 3a is reflected by the irradiated object and then received by the light receiving element 3b. Thus, the light receiving and emitting element 1 having a high sensitivity, that is, a high sensing performance, can be realized.

Here, the center of the light receiving part indicates the center of the p-type semiconductor region 32a in a plan view of the substrate 2 viewed from the p-type semiconductor region 32a side. Similarly, the center of the light emitting part indicates the center of the active layer 30d in a plan view of the substrate 2 viewed from the p-type contact layer 30f side. The p-type clad layer 30e, the p-type contact layer 30f, and the like are stacked on the upper face of the active layer 30d, and hence the center of the active layer 30d cannot directly be observed. Thus, the center of the p-type contact layer 30f may be regarded as the center of the active layer 30d. This is because each layer of the semiconductor layers is extremely thin as described above and hence, even when etching for forming the light emitting element array 3a and etching for exposing a part of the upper face of the n-type contact layer 30b are performed individually, the center of the p-type contact layer 30f substantially coincides with the center of the active layer 30d in a transparent plan view performed from the p-type contact layer 30f side.

Here, the lenses 6a and 6b are cylindrical lenses, but may be plano-convex lenses corresponding to the light receiving element 3a and the light emitting element 3b, respectively.

Here, in the fifth modified example, the upper wall 7 and the lenses 6a and 6b have been provided. However, when the light receiving and emitting element 1 and the irradiated object are installed in a short distance, the upper wall 7 and the lenses 6a and 6b may be not provided.

Next, a manufacturing method in the fifth modified example is described below briefly.

In addition to the above-described method for manufacturing the light receiving and emitting element, the light receiving and emitting element is manufactured in accordance with the following processes.

The wiring board 40 of the fifth modified example is composed of ceramics and manufactured by the following processes. First, a ceramic green sheet is prepared.

Next, metal paste for forming the first electrode 31a, the first electrode pad 31A, the second electrode 31b, the second electrode pad 31B, the third electrode 33a, the third electrode pad 33A, the fourth electrode pad 33B, and the electric wiring for connecting these electrodes and for connection to an external device is printed on the ceramic green sheet. The metal paste for forming the electric wiring may be one containing metal such as tungsten (W), molybdenum (Mo), manganese (Mn), and copper (Cu).

Here, the wiring board 40 may be composed of resin. For example, a method for manufacturing the wiring board 40 in this case may be as follows. First, precursor sheets of thermosetting resin are prepared. Then, lead terminals composed of a metallic material to form the first electrode 31a, the first electrode pad 31A, the second electrode 31b, the second electrode pad 31B, the third electrode word 3a, the third electrode pad 33A, the fourth electrode pad 33B, and the electric wiring for connecting these electrodes and for connection to an external device are disposed between the precursor sheets. Then, the plurality of precursor sheets are stacked such that the lead terminals are embedded in the precursor sheets. Examples of usable materials for forming the lead terminals include metallic materials such as copper (Cu), silver (Ag), aluminum (Al), an iron (Fe)-nickel (Ni)-cobalt (Co) alloy, and an iron (Fe)-nickel (Ni) alloy. Then, this stack is subjected to thermal curing so that the wiring board 40 is completed.

The substrate 2 is disposed on the upper face of the wiring board 40 prepared in this way. In a case where the wiring board 40 and the substrate 2 are to be electrically connected to each other by wire bonding, it is sufficient that the wiring board 40 and the substrate 2 are joined to each other with adhesives such as epoxy resin or silver paste. In the case of connection by flip-chip bonding, a brazing material such as solder, silver solder, and copper solder, a combination of gold stud bump and solder, an anisotropic electric conduction film, or the like may be used so that electric connection may be achieved simultaneously.

Then, the lenses 6a and 6b are adhered to a member in which the outer wall 4, the light-shielding wall 5, and the upper wall 7 are integrally formed, in advance by silicone resin or the like. Then, this resultant member is adhered to the upper face of the substrate 2 by using a resin-based adhesive such as epoxy resin and silicone resin or by using a double-sided tape in which an adhesive such as an acrylic pressure sensitive adhesive, a rubber-based pressure sensitive adhesive, or a silicone-based pressure sensitive adhesive are coated on a substrate such as polyester, nonwoven fabric, acrylic foam, polyimide, polyvinyl chloride (PVC), and an aluminum foil.

REFERENCE SIGNS LIST

1: Light receiving and emitting element
2: Substrate
3a: Light emitting element
3b: Light receiving element
4: Outer wall
4a: Inner space
5: Light-shielding wall
5a: Light emitting element-side light-shielding surface
5b: Light receiving element-side light-shielding surface
5c: Lower surface
6a: Light emitting element-side lens
6b: Light receiving element-side lens
7: Upper wall
8: Insulating layer
9: Adhesive
30a: Buffer layer
30b: N-type contact layer
30c: N-type clad layer
30d: Active layer
30e: P-type clad layer
30f: P-type contact layer
31A: Light emitting element-side first electrode pad
31B: Light emitting element-side second electrode pad
31a: Light emitting element-side first electrode
31b: Light emitting element-side second electrode
32: P-type semiconductor region
33A: Light receiving element-side first electrode pad
33B: Light receiving element-side second electrode pad
33a: Light receiving element-side first electrode
34: Metal lump
40: Wiring board
50a: First line segment
50b: Second line segment
100: Sensor device

The invention claimed is:

1. A light receiving and emitting element comprising:
   a substrate composed of a one-conductivity type semiconductor;
   a light emitting element which comprises a plurality of semiconductor layers are stacked on an upper face of the substrate, the plurality of semiconductor layers comprising a one-conductivity type semiconductor layer and an opposed-conductivity type semiconductor layer;
   a light receiving element having an opposed-conductivity type semiconductor region in the substrate where opposed-conductivity type impurities are doped in a vicinity of an upper face of the substrate;
   at least one electrode pad connected respectively to at least one of the substrate, the one-conductivity type semiconductor layer, the opposed-conductivity type semiconductor layer, and the opposed-conductivity type semiconductor region; and
   at least one metal lump joined to an upper face of the at least one electrode pad,
   wherein
   when the at least one electrode pad is connected to the substrate, the at least one electrode pad is disposed on a part of the upper face of the substrate which is between the light emitting element and the light receiving element, and
   when the at least one electrode pad is connected to the one-conductivity type semiconductor layer, the opposed-conductivity type semiconductor layer, or the opposed-conductivity type semiconductor region, the at least one electrode pad is disposed on the upper face of the substrate through an insulating layer.

2. The light receiving and emitting element according to claim 1, wherein
   the at least one electrode pad intersects
     with a line segment which joins one end of a side of the light emitting element which side is opposite to the light receiving element and one end of a side of the light receiving element which side is opposite to the light emitting element, and
     with a line segment which joins the other end of the side of the light emitting element which side is opposite to the light receiving element and the other end of the side of the light receiving element which side is opposite to the light emitting element.

3. The light receiving and emitting element according to claim 2, wherein
   the at least one metal lump comprises a plurality of metal lumps, and
   the plurality of metal lumps are joined to the at least one electrode pad.

4. The light receiving and emitting element according to claim 2, further comprising:
   a frame-shaped outer wall arranged on the upper face of the substrate which surrounds the light emitting element and the light receiving element; and
   a light-shielding wall located on an inner side of the frame-shaped outer wall and partitioning an inner space into spaces corresponding to the light emitting element and the light receiving element, respectively, wherein
   the light-shielding wall has a lower surface facing to the substrate; and
   a gap between the substrate and the lower surface of the light-shielding wall is smaller than a thickness of the metal lump in a normal line direction of the at least one electrode pad.

5. The light receiving and emitting element according to claim 1, wherein
the at least one electrode pad comprises a plurality of electrode pads which are aligned side by side between the light emitting element and the light receiving element,
the at least one metal lump comprises a plurality of metal lumps, and
each of a plurality of metal lumps is joined to each of the plurality of electrode pads.

6. The light receiving and emitting element according to claim 5, wherein, when a side of the light receiving element is viewed from a side of the light emitting element, adjacent metal lumps of the plurality of metal lumps overlap partly with each other.

7. The light receiving and emitting element according to claim 5, wherein, when a side of the light receiving element is viewed from a side of the light emitting element, adjacent electrode pads of the plurality of electrode pads overlap partly with each other.

8. The light receiving and emitting element according to claim 5, wherein
each of the plurality of electrode pads located at ends of an alignment of the plurality of electrode pads intersects
with a line segment which joins one end of a side of the light emitting element which side is opposite to the light receiving element and one end of a side of the light receiving element which side is opposite to the light emitting element, or
with a line segment which joins the other end of the side of the light emitting element which side is opposite to the light receiving element and the other end of the side of the light receiving element which side is opposite to the light emitting element.

9. The light receiving and emitting element according to claim 5, further comprising:
a frame-shaped outer wall arranged on the upper face of the substrate which surrounds the light emitting element and the light receiving element; and
a light-shielding wall located on an inner side of the frame-shaped outer wall and partitioning an inner space into spaces corresponding to the light emitting element and the light receiving element, respectively, wherein
the light-shielding wall has a lower surface facing to the substrate; and
a gap between the substrate and the lower surface of the light-shielding wall is smaller than a thickness of the metal lump in a normal line direction of the at least one electrode pad.

10. The light receiving and emitting element according to claim 1, further comprising:
a frame-shaped outer wall arranged on the upper face of the substrate which surrounds the light emitting element and the light receiving element; and
a light-shielding wall located on an inner side of the frame-shaped outer wall and partitioning an inner space into spaces corresponding to the light emitting element and the light receiving element, respectively, wherein
the light-shielding wall has a lower surface facing to the substrate; and
a gap between the substrate and the lower surface of the light-shielding wall is smaller than a thickness of the metal lump in a normal line direction of the at least one electrode pad.

11. A sensor device, comprising:
a light receiving and emitting element according to claim 1, wherein
light being projected from the light emitting element onto an irradiated object, and
in accordance with an output current from the light receiving element outputted in correspondence to reflected light from the irradiated object, at least one of position information, distance information, and concentration information of the irradiated object is detected.

12. The light receiving and emitting element according to claim 1, wherein
the at least one metal lump comprises a plurality of metal lumps, and
the plurality of metal lumps are joined to the at least one electrode pad.

13. The light receiving and emitting element according to claim 12, wherein, when a side of the light receiving element is viewed from a side of the light emitting element, adjacent metal lumps of the plurality of metal lumps overlap partly with each other.

14. The light receiving and emitting element according to claim 12, further comprising:
a frame-shaped outer wall arranged on the upper face of the substrate which surrounds the light emitting element and the light receiving element; and
a light-shielding wall located on an inner side of the frame-shaped outer wall and partitioning an inner space into spaces corresponding to the light emitting element and the light receiving element, respectively, wherein
the light-shielding wall has a lower surface facing to the substrate; and
a gap between the substrate and the lower surface of the light-shielding wall is smaller than a thickness of the metal lump in a normal line direction of the at least one electrode pad.

15. The light receiving and emitting element according to claim 1, wherein
the plurality of electrode pads comprise a first electrode pad and a second electrode pad which are connected to a light emitting element, and
the first electrode pad and the second electrode pad are located on both sides of the light emitting element.

16. The light receiving and emitting element according to claim 15, wherein
the plurality of electrode pads further comprise a third electrode pad and a fourth electrode pad which are connected to a light receiving element, and
both of the third electrode pad and the fourth electrode pad and the second electrode pad are located on both sides of the light receiving element.

17. The light receiving and emitting element according to claim 16, further comprising:
a frame-shaped outer wall arranged on the upper face of the substrate which surrounds the light emitting element and the light receiving element; and
a light-shielding wall located on an inner side of the frame-shaped outer wall and partitioning an inner space into spaces corresponding to the light emitting element and the light receiving element, respectively, wherein
the light-shielding wall has a lower surface facing to the substrate; and
a gap between the substrate and the lower surface of the light-shielding wall is smaller than a thickness of the metal lump in a normal line direction of the at least one electrode pad.

18. The light receiving and emitting element according to claim 15, further comprising:
- a frame-shaped outer wall arranged on the upper face of the substrate which surrounds the light emitting element and the light receiving element; and
- a light-shielding wall located on an inner side of the frame-shaped outer wall and partitioning an inner space into spaces corresponding to the light emitting element and the light receiving element, respectively, wherein
- the light-shielding wall has a lower surface facing to the substrate; and
- a gap between the substrate and the lower surface of the light-shielding wall is smaller than a thickness of the metal lump in a normal line direction of the at least one electrode pad.

19. The light receiving and emitting element according to claim 1, wherein
- a thickness of the metal lump is larger than a thickness of the light emitting element.

20. The light receiving and emitting element according to claim 19, further comprising:
- a frame-shaped outer wall arranged on the upper face of the substrate which surrounds the light emitting element and the light receiving element; and
- a light-shielding wall located on an inner side of the frame-shaped outer wall and partitioning an inner space into spaces corresponding to the light emitting element and the light receiving element, respectively, wherein
- the light-shielding wall has a lower surface facing to the substrate; and
- a gap between the substrate and the lower surface of the light-shielding wall is smaller than a thickness of the metal lump in a normal line direction of the at least one electrode pad.

* * * * *